United States Patent [19]
McClure

[11] Patent Number: 6,037,792
[45] Date of Patent: Mar. 14, 2000

[54] BURN-IN STRESS TEST MODE

[75] Inventor: David Charles McClure, Carrollton, Tex.

[73] Assignee: STMicroelectronics, Inc., Carrollton, Tex.

[21] Appl. No.: 08/771,645

[22] Filed: Dec. 21, 1996

[51] Int. Cl.[7] .................................................. G01R 31/28
[52] U.S. Cl. ........................................ 324/760; 324/763
[58] Field of Search ................................ 324/73.1, 158.1,
324/763, 765; 365/200, 201; 371/24.1;
714/25, 733, 724, 719; 438/14, 17, 18;
257/40, 48

[56] References Cited

U.S. PATENT DOCUMENTS

| | | | |
|---|---|---|---|
| 5,068,599 | 11/1991 | Niehaus | 324/73.1 |
| 5,349,290 | 9/1994 | Yamada | 324/158.1 |
| 5,656,944 | 8/1997 | Choi | 324/763 |
| 5,745,499 | 4/1998 | Ong | 371/21.4 |

*Primary Examiner*—Vinh P. Nguyen
*Attorney, Agent, or Firm*—Theodore E. Galanthay; Lisa K. Jorgenson; Renee M. Larson

[57] ABSTRACT

An integrated circuit structure and method provides a burn-in stress test mode that facilitates stress testing of an integrated circuit device in a burn-in oven. The integrated circuit structure and method is capable of disabling a time-out feature of an IC memory device during a stress test mode of the device in order to facilitate stress testing of the device in a burn-in oven. The integrated circuit structure provides for entry into the burn-in stress test mode when a supply voltage supplied to the integrated circuit device exceeds a predetermined voltage level and/or the temperature of the integrated circuit device exceeds a predetermined temperature level.

20 Claims, 2 Drawing Sheets

BURN-IN STRESS TEST MODE

CROSS-REFERENCE TO RELATED APPLICATIONS

The subject matter of the present application is related to copending United States application, titled "Edge Transition Detection Circuitry for Use with Test Mode Operation of an Integrated Circuit Memory Device", Docket Number 96-C127, filed on Dec. 21, 1996, which is assigned to the assignee hereof, and which is herein incorporated by reference.

BACKGROUND OF THE INVENTION

1. Technical Field

The present invention relates generally to Integrated Circuit (IC) memory devices and more specifically to burn-in stress testing of synchronous IC memory devices.

2. Discussion of the Prior Art

Low power integrated circuit (IC) memory devices possess a time-out feature that enables the device to conserve power. The time-out feature of a static random access memory (SRAM) device, for instance, may conserve power by turning off all wordlines of a memory cell after a given period of time. For a 1 Meg SRAM device the time-out feature may cause the wordlines of the memory cell to be turned off after approximately 40 nS to 50 nS.

While this time-out feature conserves power and thus makes the device a low power device, devices having this time-out feature are difficult to stress test in a burn-in oven since the wordlines must be on in order to stress the memory cells of the device. The devices cycle at no faster than several microseconds. Thus, for the majority of the time of a given memory cycle, such as all but 40 nS to 50 nS in our example, the wordlines are off and the memory cells are not being stressed at all. In order to compensate for this small window of opportunity during which memory cells of the device may be stress tested, the device must be put through many cycles while in the burn-in oven. Increasing the time required in the burn-in oven of course increases the cost of stress testing a device.

There is thus an unmet need in the art to be able to disable a time-out feature of an IC memory device during a stress test mode of the device in order that stress testing of the device in a burn-in oven may be accomplished in a timely and economical manner. It is desirable that any solution that allows for the time-out feature of an IC memory device to be disable be compatible with the existing pin-out of the IC memory device.

SUMMARY OF THE INVENTION

It is an object of the invention to disable a time-out feature of an IC memory device during a stress test mode of the device in order that stress testing of the device in a burn-in oven may be accomplished in a timely and economical manner.

It is further an object of the invention to disable the time-out feature of an IC memory device during a stress test mode of the device by leaving on the wordlines of the device for the duration of the memory cycle for maximum burn-in efficiency.

It is yet another object of the invention to disable the time-out feature of an IC memory device during a stress test mode of the device using the existing pin-out of the IC memory device.

In accordance with the present invention, an integrated circuit structure and method provides a burn-in stress test mode that facilitates stress testing of an integrated circuit device in a burn-in oven. The integrated circuit structure and method is capable of disabling a time-out feature of an IC memory device during a stress test mode of the device in order to facilitate stress testing of the device in a burn-in oven. The integrated circuit structure employed is a burn-in stress test mode circuit of an integrated circuit device.

The integrated circuit structure provides for entry into the burn-in stress test mode when a supply voltage supplied to the integrated circuit device exceeds a predetermined voltage level and/or the temperature of the integrated circuit device exceeds a predetermined temperature level. The supply voltage and/or temperature are monitored and when the supply voltage and/or temperature exceeds the predetermined level, entry into a burn-in mode of the integrated circuit device that disables the time-out feature of the integrated circuit device is affected. A device flag or a device pin of the integrated circuit device may be monitored to determine when the integrated circuit device is in the burn-in mode.

BRIEF DESCRIPTION OF THE DRAWINGS

The novel features believed characteristic of the invention are set forth in the claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The present invention provides a burn-in stress test mode that is capable of disabling a time-out feature of an IC memory device during a stress test mode of the device in order to facilitate stress testing of the device in a burn-in oven in a timely and economical manner. The time-out feature of an IC memory device is disabled during the burn-in stress test mode by leaving on the wordlines of the device for the duration of the memory cycle for maximum burn-in efficiency.

A major concern of the present invention is the ability to enter into the burn-in stress test mode at the package level of the device. In many IC memory devices there may be no pins available which may be dedicated to enable or enter the burn-in stress test mode. On an asynchronous memory device, for instance, any pin sequence or combination of pin sequences may be needed for device operation and thus the use of device pins to enter the burn-in stress test mode is not a feasible solution. In addition to the dearth of device pins with which to enter the burn-in stress test mode, the use of a greatly elevated voltage such as 15 volts for a CMOS (complementary metal oxide silicon) device on the device pin is likewise an unworkable solution in light of the fact that burn-in ovens do not accommodate the use of greatly elevated voltage levels.

Operating conditions for the normal operating mode and the burn-in operating mode of an integrated circuit memory device differ with respect to voltage levels and temperature ranges. The temperature of an integrated circuit device tracks changes in operating voltage of the device. Consider again the case of a 1 Meg SRAM memory device. The 1 Meg SRAM memory device has a normal operating range of approximately 2.7 volts to 3.6 volts at a maximum temperature of approximately 85 degrees Celsius. Burn-in of the integrated circuit memory device occurs at significantly higher voltage and temperature conditions in order to accelerate weak bit failures and infant life failures. Thus burn-in of the 1 Meg SRAM device during the burn-in operating mode may occur at 6 volts and 125 degrees Celsius.

The differences in voltage operating conditions between normal operation and burn-in operation are used by the present invention to accomplish entry into the burn-in stress test mode only during the elevated voltage condition consistent with burn-in operation. Entry into the burn-in stress test mode is accomplished internally to the memory device upon sensing the elevated voltage and/or temperature condition characteristic of burn-in operation. Thus, no external control through the device pins is required for entry into the burn-in stress test mode.

Figure 1:
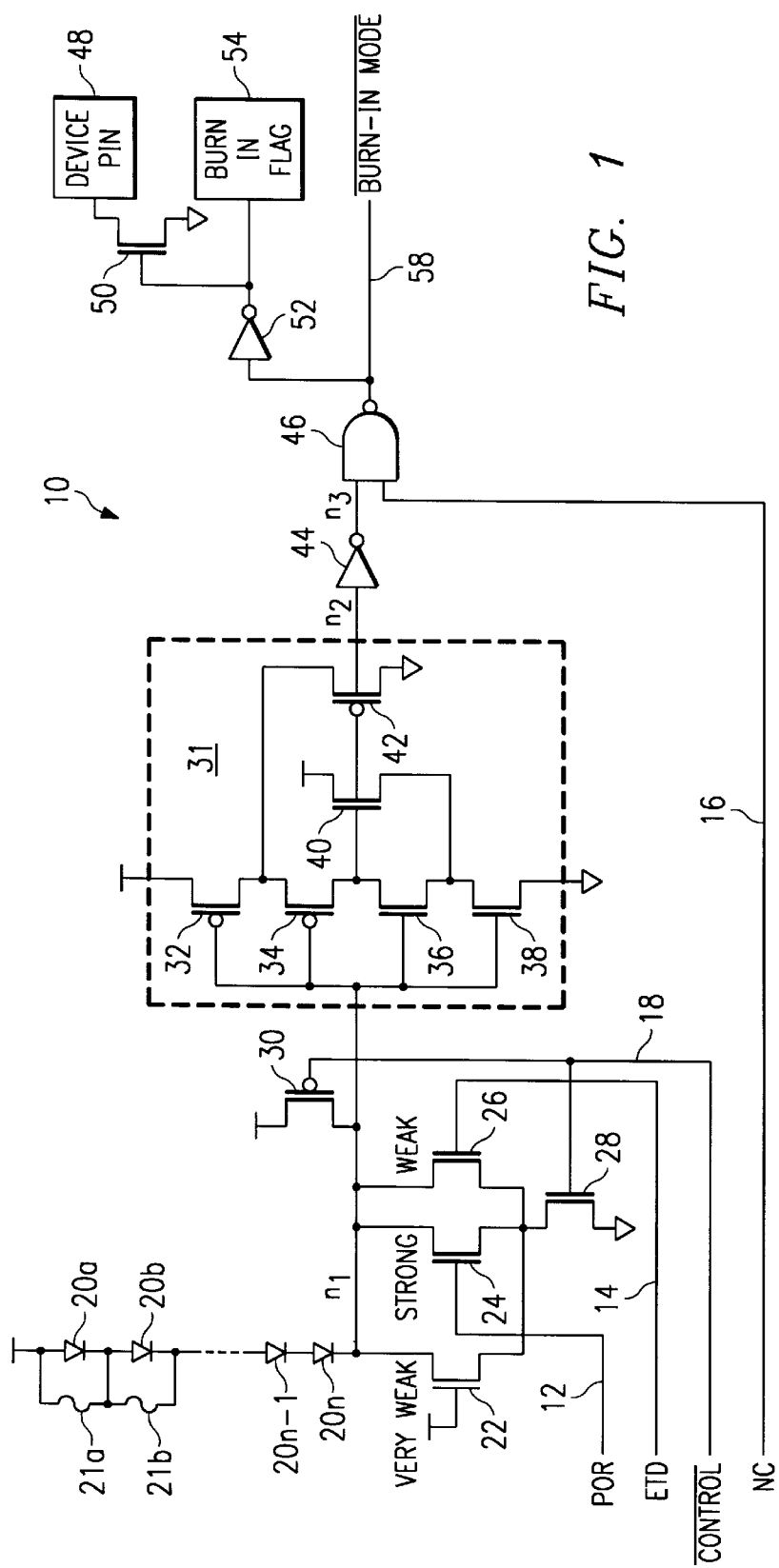
FIG. 1 is a burn-in stress test mode circuit, according to the present invention.

Referring to FIG. 1, burn-in stress test mode circuit 10 detects when supply voltage Vcc to the device exceeds a predetermined voltage level and accommodates entry into the stress test mode when the predetermined voltage level is exceeded. Circuit 10 has n number of diodes 20a . . . 20n; fuses 21a, 21b; n-channel MOS transistors 22, 24, 26, 28, 36, 38, 40, and 50; p-channel MOS transistors 30, 32, 34, and 42; inverter 44; logic element NAND gate 46; and burn-in flag 54. Transistors 32, 34, 36, 38, 40, and 42 form Schmitt trigger 31. Power-On Reset (POR) signal 12, ETD (Edge Transition Detection) signal 14, No Connect signal (NC) 16 attached to a No Connect pin not shown, and Control bar signal 18 are supplied to circuit 10. Circuit 10 generates Burn-In Mode bar signal 58. Burn In Flag 54 indicates when the IC device is in the burn-in mode; alternately, a weak transistor 50 is connected to an input or an output Device Pin 48 through which the device may be monitored to determine if it is in the burn-in test mode.

Node n1 is formed by the electrical connection of the output of programmable diode stack 20a . . . 20n, the source/drains of transistors 22, 24, and 30, and the gates of transistors 32, 34, 36, 38 of Schmitt trigger 31 as shown in FIG. 1. It should be noted that while diode stack 20a . . . 20n is shown as having a number of diodes, diode stack can be comprised of just one diode or any number of diodes. Transistor 22 is a very weak transistor and thus node n1 is characterized as having a very weak static load on it. Transistor 24 is a strong transistor whose gate is controlled by POR signal 12. Transistor 26 is a weak transistor whose gate is controlled by EDT signal 14.

As mentioned, the gates of the transistors 32, 34, 36, 38 of Schmitt trigger 31 help form node n1. Transistors 32, 34, 36, 38 are serially connected as shown in FIG. 1, with a first source/drain of transistor 32 connected to supply voltage Vcc and a second source/drain of transistor 38 connected to supply voltage Vss. Transistor 40 has a first source/drain connected to supply voltage Vcc and a second source/drain connected to the common node formed by a second source/drain of transistor 36 and a first source/drain of transistor 38. The gate of transistor 40 is connected to a second source/drain of transistor 34, a first source/drain of transistor 36, the gate of transistor 42, and the input terminal of inverter 44 to form node n2. A first source/drain of transistor 42 is connected to a second source/drain of transistor 32 and a second source/drain of transistor 34; a second source/drain of transistor 42 is connected to supply voltage Vss. Node n3 is formed by the output terminal of inverter 44 and a first input terminal of logic element NAND gate 46. A second input terminal of NAND gate 46 is driven by NC signal 16. NAND gate 46 generates Burn-In Mode bar signal 58.

Diode stack 20a . . . 20n is made programmable by the presence of fuses 21 which may be connected in parallel with a diode 20 of diode stack 20a . . . 20n as shown. Blowing a fuse 21 causes the diode 20 to which the fuse 21 is connected in parallel to be included in the diode stack 20a . . . 20n, since the diode 20 will no longer be shorted out once the fuse 21 is blown. Thus, in the example shown in FIG. 1, blowing fuse 21a but not blowing fuse 21b would result in diode 20a being included in diode stack 20a . . . 20n and diode 20b being excluded from diode stack 20a . . . 20n. It should be noted that a fuse 21 may or may not be placed in parallel with a diode 20 of diode stack 20a . . . 20n; as shown in FIG. 1, diodes 20a and 20b have fuses 21a and 21b connected in parallel with them, respectively, while diodes 20n−1 and 20n do not have a fuse connected in parallel with them. Thus, the decision of how many of the diodes 20 of diode stack 20a . . . 20n should be connected in parallel with a fuse 21 is a function of the level of programmability desired for the diode stack 20a . . . 20n.

Figure 2:
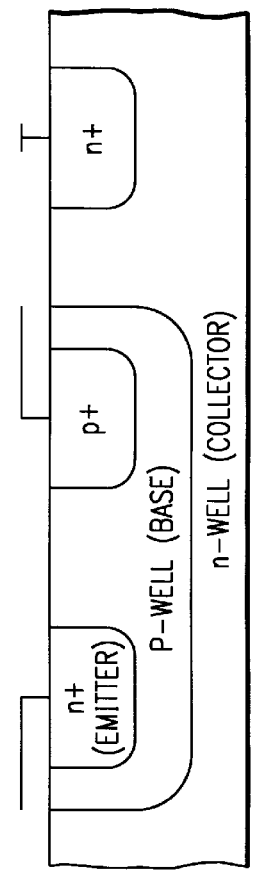
FIG. 2 is a device representation of a diode of a diode stack, according to the present invention.

Upon power-up of the device, POR signal 12 pulses high which forces node n1 to a low state initially. Programmable diode stack 20a . . . 20n is connected between node n1 and Vcc as shown. A diode of diode stack 20a . . . 20n is an n+ junction in a p-well, assuming an n-substrate n-p-n device of the type shown in FIG. 2. These p-n diodes 20 provide much greater stability over process variations than that which could be afforded by transistors. The diodes of diode stack 20a . . . 20n should be laid out remotely from other circuits, be well strapped and employ a guardring/dummy collector structure to prevent device latchup. MOSFET connected diodes could be employed in place of the p-n diodes shown. MOSFET connected diodes, however, may be less desirable than p-n diodes because they vary more over process and temperature than do p-n junction diodes which are more tightly controlled over process and temperature variations.

As supply voltage Vcc rises, node n1 will begin rising once Vcc exceeds the diode forward bias voltage drop. At the burn-in temperature of approximately 125 degrees Celsius, the diode forward bias voltage drop of each diode 20 is approximately 0.3 volts. Assuming that the diode stack 20a . . . 20n has thirteen (13) diodes, 20a . . . 20m, connected in series, node n1 will start to rise at 3.9 volts. It should be noted that by prudently choosing the number of diodes in the diode stack 20a . . . 20n no DC (direct current) is consumed at the normal operating range of 3.6 volts or less.

In order to trigger entry of the device into the burn-in stress test mode, supply voltage Vcc must exceed a predetermined voltage level defined as the diode forward bias voltage drop of diode stack 20a . . . 20n plus the trip point of Schmitt trigger 31. Thus, assuming that the diode forward bias voltage drop of diode stack 20a . . . 20n is approximately 3.9 volts and the trip point of Schmitt trigger 31 is approximately 1.6 volts, Vcc must be greater than 5.5 volts to trigger entry into the burn-in stress test mode. At 5.5 volts, node n2 will go to a low state and node n3 will go to a high state.

Schmitt trigger 31, located between nodes n1 and n2, provides hysteresis and noise immunity as voltage supply Vcc slowly ramps up. The diode forward biased voltage drop associated with each diode 20 increases at lower temperatures at the rate of approximately −2.1 mV per degree Celsius. Thus at the lower temperature of approximately 25 degrees Celsius, the diode forward biased voltage drop is approximately 0.5 volts; compare this with the 0.3 volt drop at 125 degrees Celsius noted above. Schmitt trigger 31 therefore provides immunity against mistakenly entering the burn-in stress test mode under normal operating conditions since, using the example discussed above, Vcc must be 13 times 0.5 volts, or 6.5 volts, before node n1 starts rising.

Control bar signal 18 controls the gate of pull-down transistor 28 and pull-up transistor 30. Control bar signal 18 may be a function of a Chip Enable signal or other suitable control signal of the memory device. Thus, Control bar signal 18 is a low true signal that goes low when in a stress test mode or when the memory device is deselected. During the burn-in stress test mode, Control bar signal 18 goes low to disable the DC (direct current) current path through diode stack 20a . . . 20n, through transistors 22, 24, down through transistor 28 to ground that exists while the device is being stressed at an elevated voltage of 6 volts or more. NC signal 16 is an optional signal that may be used to externally inhibit entry into the burn-in stress test mode if desired. A No Connect pin which provides NC signal 16 may be any device pin specified as a no-connect in the pinout of the datasheet of the device or any device pin which does not have to be exercised. For instance, an output enable (OE) pin of the device could be readily used in place of the No Connect pin. The No Connect pin would recognize the time-out feature of the device, thereby causing the output of NAND gate 46, Burn-In Mode bar signal 58, to ignore the output of Schmitt trigger 31. The signal at node n3 and NC signal 16 are input signals to NAND logic gate 46. If NC signal 16 is a low state, then Burn-in mode bar signal 58 would be forced high, thereby allowing for the time-out circuit of the device to operate so that operational life (op-life) studies of the device may be conducted. Op-life studies predict how long the device may be expected to last in normal operation.

Burn-In Mode bar signal 58 indicates when the device has successfully entered the burn-in stress test mode. The status of Burn-In Mode bar signal 58 may be monitored either through Burn In Flag 54 or through a Device Pin 48. Burn-In Flag 54 is useful in indicating when the device has entered the burn-in stress test mode since it is not readily apparent when the device has or has not timed out. Burn-in flag 54 may be a test pad at wafer level which accommodates testing of the device. Device Pin 48 may be an input pin or an output pin of the device. At the device package level, a weak leakage transistor 50 is connected to Device Pin 48; transistor 50, as a weak leakage transistor, causes approximately 10 to 100 μA of pin leakage. No Connect pin 16 is a package pin of the IC memory device that similarly may be monitored.

Burn-in stress test mode circuit 10 of FIG. 1 has Edge Transition Detection (ETD) capabilities as well. ETD (Edge Transition Detection) pulse 14 is a high-going pulse that controls the gate of weak n-channel ETD transistor 26 as shown in FIG. 1. ETD pulse 14 initializes node n1 on every pulse and is triggered by a change in state of an address pin or control pin of the IC memory device. ETD pulse 14 resets the integrated circuit device and thus protects against the device accidentally entering the test mode.

The ETD capabilities of FIG. 1 can be used in conjunction with different forms of test mode entry besides the burn-in test mode described above. For instance, the ETD aspect of FIG. 1 can be used for test mode entry that requires that an elevated or "supervoltage" be applied to a pin of the IC memory device. ETD pulse 14 controls weak ETD transistor 26 by controlling its gate. Diode stack 20a . . . 20n is capable of overcoming ETD transistor 26 if the diodes of diode stack 20a . . . 20n are conducting, but weak ETD transistor 26 is capable of discharging node n1 quickly if the diodes of diode stack 20a . . . 20n are not conducting. Thus on every cycle of the IC memory device, node n1 is reinitialized to guard against Vcc noise spikes that can trigger accidental entry into the test mode.

As an example, consider the consequences of a voltage spike without the benefit of ETD pulse 14 controlled weak ETD transistor 26. If supply voltage Vcc were to spike up to 5.5 volts temporarily, then node n1 would correspondingly be pulled-up and then be very slowly discharged by very weak transistor 22. The addition of ETD transistor 26 to the circuitry of FIG. 1 would pull-down node n1 very quickly in response to a voltage spiking condition of Vcc and therefore avoid triggering false entry into the test mode. The ETD transistor 26 compensates for the complicated elevated voltage multiple clocking on a test pin and the numerous registers that would be required to enter into a supervoltage test mode and the various sequences that would be required to exit the supervoltage test mode.

The diodes of diode stack, rather than being capable of overcoming ETD transistor 26, can be sized so that there are incapable of overcoming ETD transistor 26. ETD transistor 26 would not be a weak transistor, so that every cycle the memory device would be at least temporarily taken out of the test mode for the duration of the test mode in order to prevent false triggering, or entry, of the memory device into the test mode. This occurs regardless of whether the memory device is supposed to be in the test mode. After the ETD pulse, the memory device enters the test mode if it is intended to be in the test mode and if the time-out feature of the memory device has not commenced.

Figure 3:
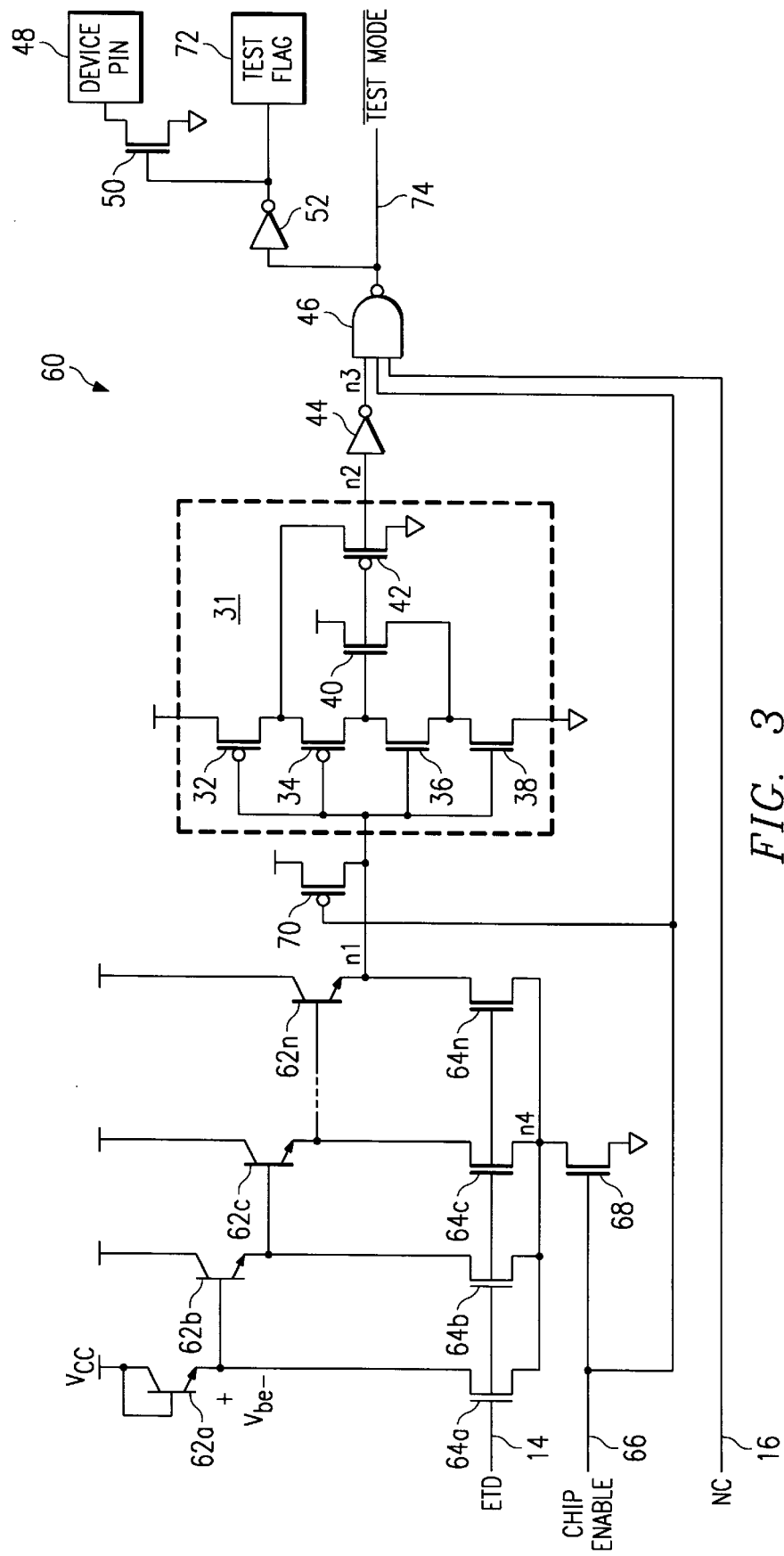
FIG. 3 is an alternate embodiment of stress test mode circuitry, according to the present invention.

Referring to FIG. 3, another implementation of a stress test mode circuit, according to the present invention, is shown. The ETD capability of FIG. 3 again re-initializes node n1 to guard against Vcc noise spikes that can trigger accidental entry into a test mode. The ETD capability of FIG. 3 is capable of being used with any number of different methods of test mode entry in addition to the method described in conjunction with FIGS. 1 and 2. For instance, a memory device requiring an elevated or "supervoltage" on a device pin in order to enter a test mode may use the circuitry of FIG. 3.

Test mode circuit 60 of FIG. 3 has a number of bipolar transistors 62a . . . 62n, ETD transistors 64a . . . 64n, transistor 68, transistor 70, the Schmitt trigger 31 described above and shown in FIG. 1, inverters 44, 52, NAND logic gate 46 that has three input signals rather than two input signals contrary to FIG. 1, transistor 50, output Device Pin 48, and Test Flag 72. Circuit 60 is provided with ETD pulse 14, Control bar signal 18, and No Connect (NC) signal 16 and generates Test Mode bar signal 74. Test Flag 72 indicates when the IC device is in the test mode; alternately, weak transistor 50 is connected to an input or an output Device Pin 48 through which the device may be monitored to determine if it is in the test mode.

The ETD transistors 64a . . . 64n could be replaced with static loads wherein ETD pulse 14 could be tied to supply voltage Vcc. Alternately, a transistor could be placed in parallel with each ETD transistor 64a . . . 64n, wherein each such transistor being placed in parallel with an ETD transistor 64 has its gate controlled by supply voltage Vcc.

In FIG. 3, the diodes of diode stack 20a . . . 20n of FIG. 1 have been replaced with parasitic bipolar transistors 62a . . . 62n. ETD transistors 64a . . . 64n are weak transistors controlled by ETD pulse 14 and operate to ensure that the emitter of each bipolar transistor 62 is Vbe (base-to-emitter voltage) volts lower than its base voltage Vb. The ETD transistors 64a . . . 64n, then, address the case where the bipolar transistors 62a . . . 62n are leaky between collector and emitter and operate to pull up the emitter too close to supply voltage Vcc. Without ETD transistors 64a . . . 64n, the only current drain from the emitter of a bipolar transistor 62 is the very small base current of the next bipolar transistor. ETD transistors 64a . . . 64n also address Vcc noise concerns.

Weak transistors having gates tied to supply voltage Vcc can be placed in parallel with ETD transistors 64a . . . 64n, but this arrangement would provide a current path and therefore standby current introduced by the load of the weak transistors. Inclusion of Control bar signal 18 that is a function of a Chip Enable signal in FIG. 3 provides a distinct advantage in that it eliminates this type of direct current path when the memory device is deselected (Chip Enable signal low).

Control bar signal 18 controls the gate of pull-down transistor 68 and pull-up transistor 70. During a test mode, Control bar signal 18 goes low to disable the DC (direct current) current path through bipolar transistors 62a . . . 62n, ETD transistors 64a . . . 64n, and transistor 68 to ground. Control bar signal 18 is also an input signal to gate 46 that goes high during normal operation of the memory device to inhibit entry into the test mode or to cause the test mode to be exited. Similarly, NC signal 16 is an optional signal that may be used to externally inhibit entry into the burn-in stress test mode if desired or to force the memory device to exit the test mode. An active low signal of either Control bar signal 18 and NC signal 16 will cause the output of NAND gate 46, Test Mode bar signal 74 to ignore the output of Schmitt trigger 31.

Similarly, a p-channel transistor could be placed in series with the collectors of bipolar transistors 62a . . . 62n to power supply Vcc and transistor 70 would be replaced by an n-channel transistor connected between node n1 to ground. The gates of the p-channel transistor and the n-channel transistor would be controlled by Control bar signal 18. The source of the p-channel transistor would be connected to supply voltage Vcc. In this implementation, NAND gate 46 would be a two input gate having only two input signals provided to it: the signal at node n3 and NC signal 16.

While the invention has been particularly shown and described with reference to a preferred embodiment, it will be understood by those skilled in the art that various changes in form and detail may be made therein without departing from the spirit and scope of the invention.

What is claimed is:

1. A method of entering a burn-in mode of an integrated circuit device in a burn-in oven, said method comprising the steps of:

monitoring a supply voltage supplied to the integrated circuit device;

detecting when the supply voltage exceeds a predetermined voltage level;

entering a burn-in mode of the integrated circuit device when the supply voltage exceeds the predetermined voltage level; and disabling a time-out feature of the integrated circuit device, in which the integrated circuit is made to consume less power after a period of time, upon entry into the burn-in mode by leaving on at least a wordline of a plurality of wordlines of the integrated circuit device for the duration of a memory cycle of the integrated circuit device.

2. The method of claim 1, wherein the step of entering the burn-in mode is accomplished internal to the integrated circuit device so that external control of a pin of the integrated circuit device is not required to enter the burn-in mode.

3. The method of claim 1, wherein the integrated circuit device is a static random access memory (SRAM).

4. The method of claim 1, wherein the predetermined voltage level is equal to a diode stack forward bias voltage drop of a diode stack plus a voltage trip point of a logic element.

5. The method of claim 4, wherein the logic element is a Schmitt trigger.

6. The method of claim 4, wherein the diode stack comprises one or more p-n junction diodes and the diode stack forward bias voltage drop is determined by the one or more p-n junction diodes.

7. The method of claim 4, wherein the diode stack comprises one or more MOSFET diodes and the diode stack forward bias voltage drop is determined by the one or more MOSFET diodes.

8. The method of claim 4, wherein the diode stack and the logic element are part of a stress test mode circuit of the integrated circuit device.

9. The method of claim 1, comprising the further steps of:

detecting when the supply voltage drops to a voltage that is equal to or below the predetermined voltage level; and exiting the burn-in mode when the supply voltage drops to a voltage that is equal to or below the predetermined voltage level.

10. The method of claim 9, comprising the further step of:

entering a normal operating mode of the integrated circuit device upon exiting the burn-in mode.

11. The method of claim 10, wherein determining whether the integrated circuit device is in the burn-in mode or in the normal operating mode at any given time is accomplished by monitoring an external element of the integrated circuit device.

12. The method of claim 11, wherein the external element is a flag of the integrated circuit device.

13. The method of claim 11, wherein the external element is a pin of the integrated circuit device.

14. The method of claim 1, wherein in the burn-in mode leakage current is monitored on an external device pin of the integrated circuit device.

15. The method of claim 1, wherein entry into the burn-in mode is inhibited when an external signal supplied to a pin of the integrated circuit device is asserted, even when the supply voltage exceeds the predetermined voltage level, and wherein the burn-in mode is exited after it has been entered when the external signal supplied to the pin is asserted, even if the supply voltage exceeds the predetermined voltage level.

16. The method of claim 1, comprising the further steps of:

monitoring the temperature of the integrated circuit device;

detecting when the temperature exceeds a predetermined temperature level; and entering the burn-in mode of the integrated circuit device when the temperature of the integrated circuit device exceeds the predetermined temperature level.

17. The method of claim 16, wherein entry into the burn-in mode is inhibited when an external signal supplied to a pin of the integrated circuit device is asserted, even when the temperature of the integrated circuit device exceeds the predetermined temperature level, and wherein the burn-in mode is exited after it has been entered when the external signal supplied to the pin is asserted, even if the temperature of the integrated circuit device exceeds the predetermined temperature level.

18. The method of claim 1, wherein while in the burn-in mode, a control signal disables a DC current path of the integrated circuit device.

19. The method of claim 1, comprising the further steps of:

monitoring a temperature of the integrated circuit device;

detecting when the temperature of the integrated circuit device exceeds a predetermined temperature level;

entering the burn-in mode of the integrated circuit device when the temperature of the integrated circuit device exceeds the predetermined temperature level;

detecting when the temperature of the integrated circuit device drops to a temperature that is equal to or below the predetermined temperature level; and exiting the burn-in mode when the temperature of the integrated circuit device drops to a temperature that is equal to or below the predetermined temperature level.

20. The method of claim 19, wherein entry into the burn-in mode is inhibited when an external signal supplied to a pin of the integrated circuit device is asserted, even when the supply voltage exceeds the predetermined voltage level or the temperature of the integrated circuit device exceeds the predetermined temperature level, and wherein the burn-in mode is exited after it has been entered when the external signal supplied to the pin is asserted, even if the supply voltage exceeds the predetermined voltage level or the temperature of the integrated circuit device exceeds the predetermined temperature level.

* * * * *